United States Patent [19]

Negishi

[11] Patent Number: 4,879,459

[45] Date of Patent: Nov. 7, 1989

[54] AUTOMATIC POWER CONTROLLER FOR SEMICONDUCTOR LASER

[75] Inventor: Kiyoshi Negishi, Tokyo, Japan

[73] Assignee: Asahi Kogaku Kogyo Kabushiki Kaisha, Tokyo, Japan

[21] Appl. No.: 157,184

[22] Filed: Feb. 16, 1988

[30] Foreign Application Priority Data

Feb. 16, 1987 [JP] Japan .................................. 62-32868

[51] Int. Cl.$^4$ .............................................. G01J 1/32
[52] U.S. Cl. ...................................... 250/205; 372/29
[58] Field of Search ..................... 250/205; 372/29, 31

[56] References Cited

U.S. PATENT DOCUMENTS 4,605,848  8/1986  Ogawa ............................... 250/205
4,647,981  3/1987  Froelich ............................. 250/205
4,677,287  6/1987  Ejima ................................. 250/205
4,692,606  9/1987  Sakai et al. ........................ 250/205
4,695,714  9/1987  Kimizuka et al. ................. 250/205

Primary Examiner—Edward P. Westin
Assistant Examiner—Khaled Shami
Attorney, Agent, or Firm—Sughrue, Mion, Zinn, Macpeak & Seas

[57] ABSTRACT

A controller for controlling the output intensity of a semiconductor laser used in a laser printer or the like in such a manner that the desired adjustment value is obtained, even in the presence of noise in a signal $P_D$ indicating the value of the detected intensity. An adjustment value is provided depending on the results of a comparison between the signal $P_D$ and a set value $P_S$. The adjustment value is decreased when $P_S < P_D$ and increased when $P_D < P_S$. The current through the semiconductor laser is adjusted in accordance with this set value.

10 Claims, 3 Drawing Sheets

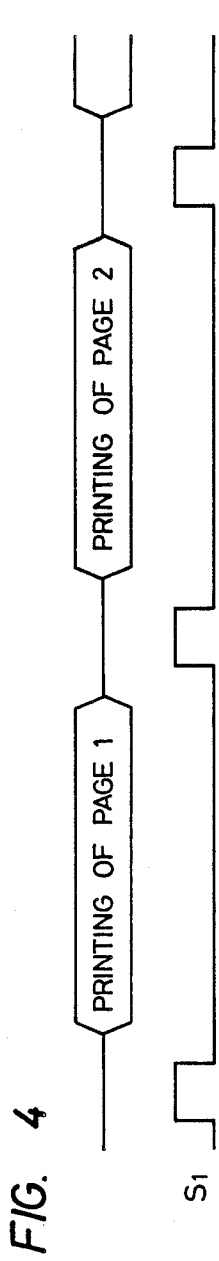
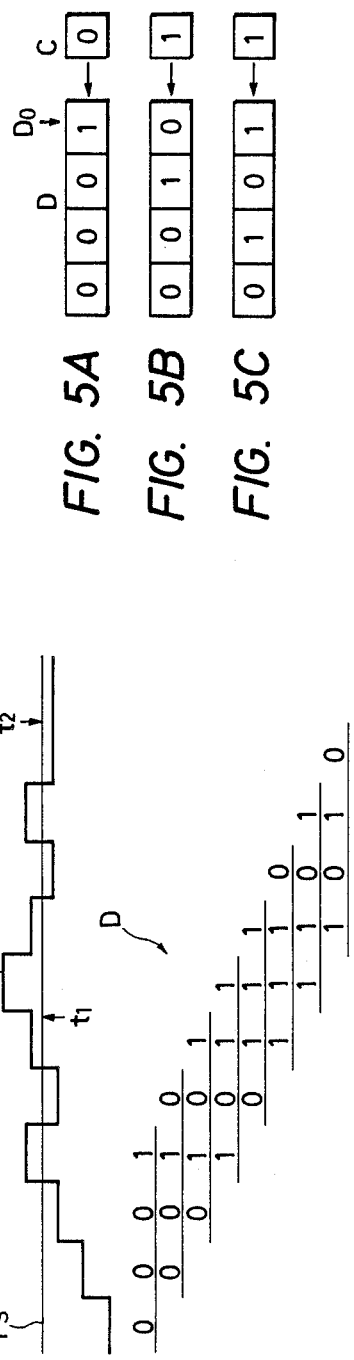
FIG. 4
FIG. 5A  FIG. 5B  FIG. 5C
FIG. 6

AUTOMATIC POWER CONTROLLER FOR SEMICONDUCTOR LASER

BACKGROUND OF THE INVENTION

The present invention relates to Automatic Power Controller (APC) with which the intensity of light emitted from a semiconductor laser used in a laser printer or the like is controlled to a set value.

Since the intensity of light emitted from a semiconductor laser has a tendency to be strongly affected by the ambient temperature, the intensity of the light emitted from the semiconductor laser is detected at the start of the printing of every page, for example, and an adjustment process is effected to adjust the semiconductor laser drive current so as to keep the intensity at a set value. Adjustment of the intensity is stopped when the detected value of the intensity of the emitted light reaches the vicinity of the set value.

However, since the photosensitive drum in a laser printer must be charged with static electricity by a corona discharge, an automatic power controller used to control the intensity of the light emitted from the semiconductor laser is likely to be affected by noise. Hence, it often occurs that the control process is stopped due to an error signal despite the fact that the intensity has not reached the region of the set value. In the case of stopping the control process due to such an error signal, the printing density may be too low or too high, or an overcurrent may flow through the semiconductor laser, causing thermal runaway and damaging the laser diode.

SUMMARY OF THE INVENTION

The present invention was made in order to solve the above mentioned problems.

Accordingly, it is an object of the present invention to provide an automatic power controller for controlling the intensity of light emitted from a semiconductor laser having a simple construction and which can stop the control process at the proper time, that is, when the intensity has become nearly equal to a set value, despite the presence of noise.

Attaining the above and other objects, the automatic power controller provided in accordance with the present invention comprises, as shown in FIG. 1, a light detector which detects the intensity of the light emitted from the semiconductor laser; means for setting a set value $P_S$; means for comparing the detected value $P_D$ of the intensity of the light with the set value $P_S$; adjustment means for providing an adjustment value depending on the result of the comparison; and laser drive means which causes an electrical current corresponding to the adjustment value to flow through the semiconductor laser; and means for sequentially storing the result of the comparison, the adjustment means functioning to increase the adjustment value when $P_D < P_S$ and decrease the adjustment value when $P_D > P_S$ and functioning so that the adjustment value or a new adjustment value altered depending on the former is established during decreasing the adjustment value, when the sequentially stored result is sequentially inverted or shifted a prescribed number of times which is two or more.

BRIEF DESCRIPTION OF THE DRAWINGS

FIG. 4 is a timing diagram showing the period during which an adjustment signal $S_1$ is at a high level;

FIGS. 5A to 5C are diagrams describing the change in a convergence pattern D used for storing the result of the comparison of an emitted light intensity detected value $P_D$ and an emitted light intensity set value $P_S$; and FIG. 6 shows the relationship between the emitted light intensity detected value $P_D$ and the emitted light intensity set value $P_S$ and the change in the convergence pattern D.

DESCRIPTION OF THE PREFERRED EMBODIMENTS

Preferred embodiments of the present invention will hereafter be described with reference to the attached drawings.

Figure 1:
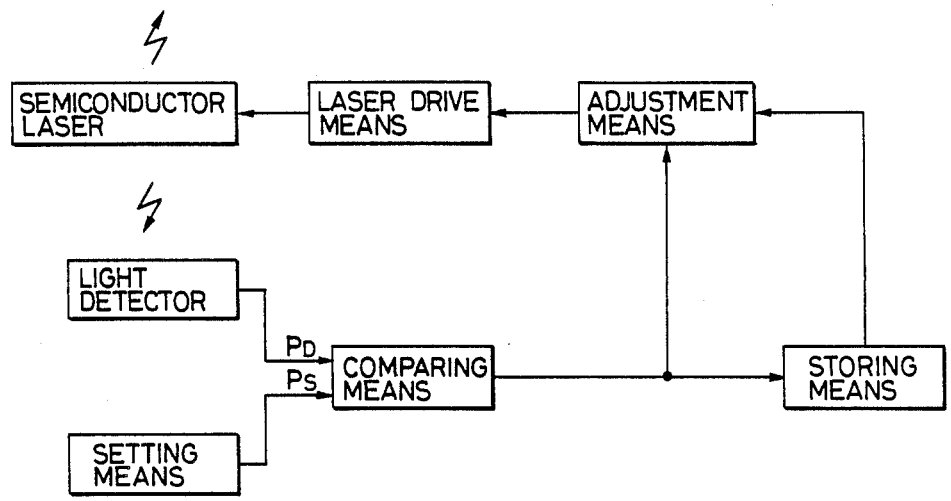
FIG. 1 is a block diagram showing the general arrangement of an automatic power controller of the invention.
Figure 2:
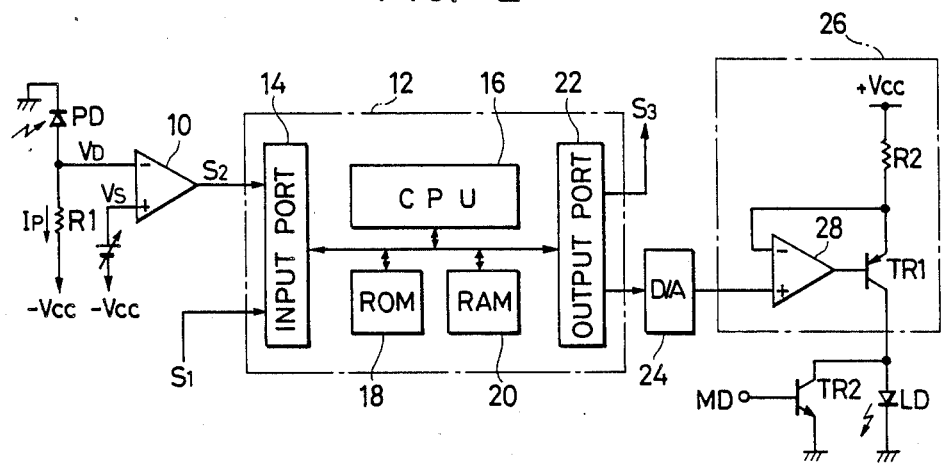
FIG. 2 shows control circuit for controlling the level of an output from a semiconductor laser.

FIG. 2 shows an Automatic Power Controller (APC) constructed according to the invention which is employed to control the optical output from a semiconductor laser of a laser printer. In this automatic power controller, some of the light emitted from a laser diode LD is detected by a PIN photodiode PD to perform feedback control to equalize the intensity of the light to a set value.

The cathode of the PIN photodiode PD is grounded and the anode thereof is connected to a power source terminal $-V_{cc}$ through a resistor $R_1$, whereby a photocurrent flowing through the PIN diode with a level depending on the intensity of the light emitted from the laser diode LD is converted into a voltage $V_D$ by the resistor. The emitted light intensity detected voltage $V_D$ is supplied to the inverting input terminal of a comparator 10 and there compared with an emitted light intensity set voltage $V_S$ supplied to the noninverting input terminal of the comparator. The result of the comparison is supplied as a binary operation signal $S_2$ to the input port 14 of a one-chip microcomputer 12 inclusive of the input port, a CPU 16, a ROM 18, a RAM 20 and an output port 22 and having a conventional arrangement.

In accordance with a program stored in the ROM 18, the CPU 16 reads the binary operation signal $S_2$ from the comparator 10 through the input port 14 and an Automatic Power Control (APC) enabling signal $S_1$ from a host microcomputer (not shown), sends and receives data to and from the RAM 20 to perform calculations and other required processing, supplies adjustment data to a D/A converter 24 through the output port 22 if necessary, and supplies the host microcomputer with an automatic power control termination signal $S_3$ indicating the termination of the control of the optical output from the semiconductor laser.

The sequence of adjustment data are changed into an analog signal by the D/A converter 24. The analog signal is supplied to the noninverting input terminal of the buffer amplifier 28 of a laser drive circuit 26 to regulate the drive current flowing through the laser diode LD.

The laser drive circuit 26 includes the buffer amplifier 28, a resistor R2 connected between the inverting terminal thereof and a power source terminal $+V_{cc}$, and a PNP transistor TR1 whose emitter is connected to the resistor R2 and the inverting input terminal of the buffer amplifier 28 and whose base is connected to the output terminal of the buffer amplifier. The collector of the PNP transistor TR1 is connected to the anode of the laser diode LD, whose cathode is grounded. The collector of an NPN transistor TR2 is connected to the anode of the laser diode LD. The emitter of the NPN transistor TR2 is grounded.

When the potential on the base of the NPN transistor TR2 is high, the transistor is turned on and the laser diode LD is turned off. A modulation signal MD is supplied to the base of the NPN transistor TR2 from the host microcomputer. The modulation signal MD is set at a low level while the optical output from the semiconductor laser is being adjusted.

The APC enabling signal $S_1$ is set to a high level for a prescribed time before the start of the printing of each page, as shown in FIG. 4. The intensity of the light emitted from the laser diode LD is controlled during the prescribed time (APC).

Figure 3:
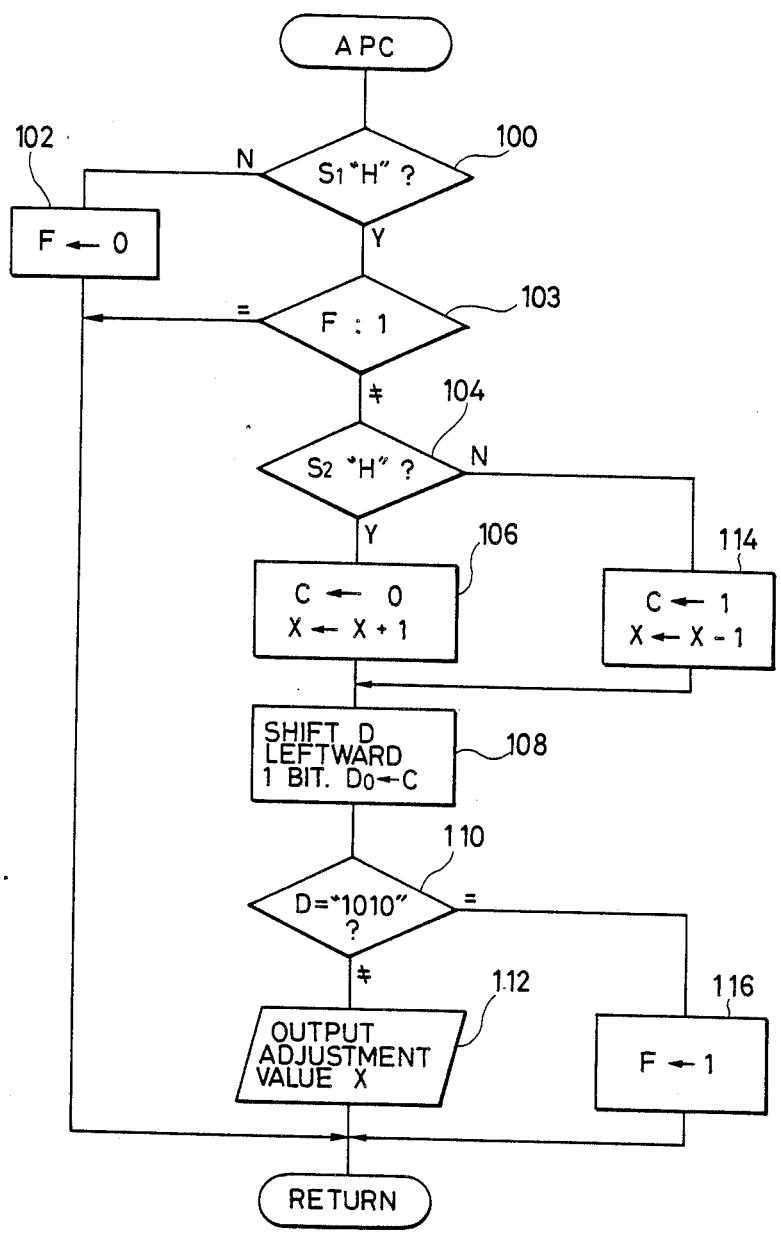
FIG. 3 is a flowchart corresponding to a program stored in a ROM shown in FIG. 2.

The flow of the control program written in the ROM 18 will now be described with reference to FIG. 3. The program is executed at prescribed intervals through timer interrupt processing, except during the printing period. In a step 100 shown in FIG. 3, it is judged whether or not the APC enabling signal $S_1$ is at the high level. When it is judged in the step 100 that the APC enabling signal $S_1$ is at a low level, a flag F indicating the termination of the control of the intensity of light emitted from the laser diode LD is reset and the processing operation before the last interrupt is thereafter resumed. When it is judged in the step 100 that the APC enabling signal $S_1$ is at the high level, it is judged in a step 103 whether the flag F has been reset. Since the flag F is already reset in the step 102, it is judged in a step 104 whether or not the binary operation signal $S_2$ is at a high level. Since the emitted light intensity detected voltage $V_D$ is lower than the emitted light intensity set voltage $V_S$ before the start of the execution of the program, it is judged that the binary operation signal $S_2$ is at the high level. A step 106 is thereafter executed to set a flag C to zero and increase an adjustment value X. At first, the adjustment value X is made zero by an initializing routine (not shown). In a step 108, a convergence pattern D in which the binary operation signals $S_2$ are sequentially stored is shifted leftward one bit, and the value of the flag C is set for the O-th bit $D_0$, which is the LSB of the convergence pattern. As a result, the pattern "D=0010" is obtained, as shown in FIG. 5B, in the case of "D=0001" and "C=0" as shown in FIG. 5A, for example. "D=0101" is obtained, as shown in FIG. 5C, as a result of executing the step 108, in the case of "D=0010" and "C=1", as shown in FIG. 5B. At first, the value of the convergence pattern D is cleared by the initializing routine. In a step 110, it is judged whether or not the value of the convergence pattern D is 1010. Initially, the value of the convergence pattern D is 0000. In a step 112, the adjustment value X is outputted to the D/A converter 24. After that, the processing routine before the last interrupt occurred is resumed.

When, as a result of repeatedly executing the steps 100, 103, 104, 106, 108, 110 and 112, it is judged in the step 104 that the binary operation signal $S_2$ has become the low level, namely, that the emitted light intensity detected voltage $V_D$ is higher than the emitted light intensity set voltage $V_S$, a step 114 is executed to set the flag C and decrease the adjustment value X. After that, the steps 108, 110 and 112 are performed.

FIG. 6 shows the relationship between the emitted light intensity detected value $P_D$ and the emitted light intensity set value $P_S$ and the change in the value of the convergence pattern D. The binary operation signal $S_2$ is changed to the high level due to the occurrence of noise despite $P_D > P_S$ at a time $t_1$, and the emitted light intensity detected value $P_D$ rises away from the emitted light intensity set value $P_S$. After that, there is no error signal produced by noise. The value of the convergence pattern D becomes 1010 at a time $t_2$. A step 116 is performed after proceeding for the step 110 to set the flag F and resume the processing routine before the last interrupt. At the next timer interrupt thereafter, the processing operation before the interrupt is resumed after proceeding from the step 110 to the step 102 because the flag F is 1, even if the APC enabling $S_1$ is at the high level. In other words, the control of the intensity of the light emitted from the laser diode LD is terminated.

Thus, even if the binary operation signal $S_2$ is erroneous due to noise, the control operation is not terminated until the emitted light intensity detected value $P_D$ has nearly reached emitted light intensity set value $P_S$. Moreover, since the control operation is terminated when the emitted light intensity detected value $P_D$ has become nearly equal to the emitted light intensity set value $P_S$ ($P_D < P_S$), the intensity of the light emitted from the laser diode LD is maintained at a constant level at the start of each printing operation to thereby cause the same printing density to be maintained from page to page. Furthermore, the control operation is always stopped at a safe side lower than the emitted light intensity set value $P_S$ so as to prevent the laser diode LD from being damaged due to thermal runaway.

Although a single-chip microcomputer 12 is used in the above described embodiment, the present invention is not limited thereto. For example, a separate up-down counter, a clock pulse generator, a shift register, a coincidence circuit, etc., can be employed instead of the single-chip microcomputer.

A setting unit, which is a component provided in accordance with the present invention, may function to set the intensity of the emitted light within a prescribed range of $P_{D1}$ to $P_{D2}$. In that case, the emitted light intensity set value $P_{D1}$ or $P_{D2}$ corresponds to the emitted light intensity set value $P_{D2}$ mentioned above.

The present invention may be also embodied so that an incremental or decremental value set by manipulating a keyboard (not shown in the drawings) is written in the RAM 20 beforehand, the incremental or decremental value is added to the adjustment value after the termination of the control operation, and the result of the addition is outputted as a new adjustment value to the D/A converter 24.

In the automatic power controller provided in accordance with the present invention used to control the optical output from a semiconductor laser, the adjustment value is increased when the emitted light intensity detected value $P_D$ is lower than the emitted light intensity set value $P_S$, the adjustment value is decreased when the emitted light intensity detected value $P_D$ is higher than the emitted light intensity set value $P_S$, and the adjustment value or a new adjustment value altered depending on the former is set when a stored result of the comparison is sequentially inverted or shifted a prescribed number of times, specifically, two or more times. For that reason, the intensity of light emitted by the semiconductor laser can be adjusted to a desired level, even if the relation between the emitted light intensity detected value $P_D$ and the emitted light intensity set value $P_S$ is mistakenly detected due to the presence of noise.

What is claimed is:

1. An automatic power controller for a semiconductor laser, comprising: a light detector for detecting the intensity of light emitted from said laser; means for setting a reference value $P_S$; means for comparing the detected value $P_D$ of said intensity with the set reference value $P_S$ and for outputting a binary value representing a result of said comparison; adjustment means for providing an adjustment value depending on the result of said comparison; laser drive means for causing an electrical current corresponding to said adjustment value to flow through said laser; and storage means for sequentially storing the result of said comparison; said adjustment means operable for increasing said adjustment value when $P_D < P_S$ and for decreasing said adjustment value when $P_D > P_S$, wherein said adjustment value is set when said sequentially stored result is sequentially shifted in said storage means a prescribed number of times of two or more.

2. The automatic power controller as defined in claim 1 wherein said adjustment value or a new adjustment value established depending on a former adjustment value is set during decreasing said adjustment value when said sequentially stored result is sequentially inverted thrice.

3. An automatic power controller for a semiconductor laser, comprising: a light detector for detecting the intensity of light emitted from said laser; means for setting a reference value $P_S$; means for comparing the detected value $P_D$ of said intensity with the set reference value $P_S$ and for outputting a binary value representing the result of said comparison; adjustment means for providing an adjustment value depending on the result of said comparison; laser drive means for causing an electrical current corresponding to said adjustment value to flow through said laser; and storage means for sequentially storing the result of said comparison; said adjustment means operable for increasing said adjustment value when $P_D < P_S$ and for decreasing said adjustment value when $P_D > P_S$, wherein said adjustment value is set when said sequentially stored result is sequentially shifted in said storage means a prescribed number of times of four or more.

4. The automatic power controller as defined in claim 1, further comprising means for storing one of an incremental and decremental value, and wherein said adjustment means provides said adjustment value depending on the result of said comparison and on said stored one of the incremental and decremental value.

5. The automatic power controller as defined in claim 3, further comprising means for storing one of an incremental and decremental value, and wherein said adjustment means provides said adjustment value depending on the result of said comparison and on said stored one of the incremental and decremental value.

6. The automatic power controller as defined in claim 1, wherein said adjustment means decreases said adjustment value as a result of said comparison directly before said adjustment value is set.

7. The automatic power controller as defined in claim 3, wherein said adjustment means decreases said adjustment value as a result of said comparison directly before said adjustment value is set.

8. The automatic power controller as defined in claim 1, wherein said sequentially storing means stores the results of said comparisons by sequentially deleting the most significant bit of said sequentially stored results, shifting each of the remaining bits of said sequentially stored results to the next most significant bit, and storing, as the least most significant bit, the last result of said comparison.

9. The automatic power controller as defined in claim 1, wherein said automatic power controller is operable for only a predetermined amount of time, the predetermined amount of time being determined by an enabling pulse.

10. The automatic power controller as defined in claim 1, wherein an amount of light which said semiconductor laser emits when the adjustment value is set is less than an amount of light which said semiconductor laser emits when the adjustment value is equal to the set reference value $P_S$.

* * * * *